United States Patent
Kay et al.

(10) Patent No.: US 8,463,209 B1
(45) Date of Patent: Jun. 11, 2013

(54) PRE-CHARGE OF A POWER AMPLIFIER PEDESTAL VOLTAGE

(75) Inventors: Michael R. Kay, Summerfield, NC (US); Alexander Wayne Hietala, Phoenix, AZ (US); Jeffery Peter Ortiz, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 411 days.

(21) Appl. No.: 12/843,672

(22) Filed: Jul. 26, 2010

Related U.S. Application Data

(60) Provisional application No. 61/228,863, filed on Jul. 27, 2009.

(51) Int. Cl.
*H04B 1/04* (2006.01)
(52) U.S. Cl.
USPC ...................................... 455/127.2; 455/126

(58) Field of Classification Search
USPC .............. 455/114.2, 115.1, 127.1, 127.2, 129
See application file for complete search history.

(56) References Cited

U.S. PATENT DOCUMENTS

| | | | |
|---|---|---|---|
| 5,150,075 A | 9/1992 | Hietala et al. | |
| 6,693,488 B1* | 2/2004 | van Rhijn | 330/129 |
| 6,903,542 B2* | 6/2005 | Ives | 324/95 |
| 7,289,777 B2* | 10/2007 | Mohsen et al. | 455/127.1 |
| 8,107,901 B2* | 1/2012 | Gailus et al. | 455/114.3 |
| 2002/0127990 A1* | 9/2002 | Bollenbeck | 455/293 |

* cited by examiner

*Primary Examiner* — Blane J Jackson
(74) *Attorney, Agent, or Firm* — Withrow & Terranova, P.L.L.C.

(57) ABSTRACT

The described devices, systems and methods include an integrator circuit having two separate operational modes to control a power output level delivered by the power amplifier to an antenna during start of a transmission burst. The first operational mode utilizes a wide bandwidth control loop to pre-charge a capacitor of the integrator circuit, which generates a pedestal voltage delivered to the power amplifier control input. The second operational mode utilizes a lower bandwidth control loop to ensure stable operation of the control loop during normal operation of the power amplifier.

19 Claims, 8 Drawing Sheets

PRE-CHARGE OF A POWER AMPLIFIER PEDESTAL VOLTAGE

This application claims the benefit of U.S. Provisional Patent Application 61/228,863, entitled PRE-CHARGE OF A POWER AMPLIFIER PEDESTAL VOLTAGE, filed Jul. 27, 2009, the disclosure of which is incorporated herein by reference in its entirety.

FIELD OF THE DISCLOSURE

This application relates to adaptively controlling the output power of a power amplifier. The application further relates to controlling the output power of a radio frequency power amplifier during commencement of a transmission burst over a wireless network.

BACKGROUND

In the Global System for Mobile Communications, GSM, there are many power levels defined by the European Telecommunications Standard Institute (ETSI) specification. As an example, each transmission burst may include a ramp up and a ramp down that is controlled in a specific manner. As another example, the ETSI specification specifies both a time mask and a spectral mask must be met by the power amplifier during a commencement of transmission burst.

Thus, a power amplifier control system is needed that allows the power amplifier to be controlled to follow a desired power profile at commencement of a transmission burst.

SUMMARY OF THE DETAILED DESCRIPTION

Embodiments in the detailed description include devices, systems, and methods for controlling a power delivered to an antenna of a communication system. The described devices, systems and methods include an integrator circuit having two separate operational modes to generate a power amplifier control signal to govern a power output level delivered by the power amplifier to an antenna during the start of a transmission burst. The first operational mode utilizes a wide bandwidth control loop to pre-charge a capacitor of the integrator circuit, which generates a pedestal voltage. The second operational mode utilizes a lower bandwidth control loop to ensure stable operation of the control loop during normal operation of the power amplifier.

An example method for controlling power delivered to an antenna of a communication system includes detecting a commencement of a transmission burst period. After a transmission burst period begins, an output power level delivered to an antenna is controlled during a first portion of the commencement of the transmission burst period based upon a first bandwidth of a control loop circuit. Thereafter, the output power level delivered by the radio frequency power amplifier to the antenna during a second portion of the commencement of the transmission burst period is controlled based upon a second bandwidth of the control loop circuit.

Another example for controlling power delivered to an antenna is a communication system including a power amplifier coupled to an antenna and a detector circuit, and which further includes a control loop circuit having a controllable bandwidth. The bandwidth of the control loop circuit may be selectively set based upon the detected power level delivered by the power amplifier to the antenna.

Still another example method for controlling a power amplifier of a communication system also includes detecting a commencement of a transmission burst. After detection of the commencement of the transmission burst, a gain of an RF power amplifier is regulated with a feedback loop as a function of a first bandwidth of the feedback loop. Upon detection that a power level delivered by the RF power amplifier exceeds a power threshold, the gain of the RF power amplifier is regulated with the feedback loop as a function of a second bandwidth of the feedback loop.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
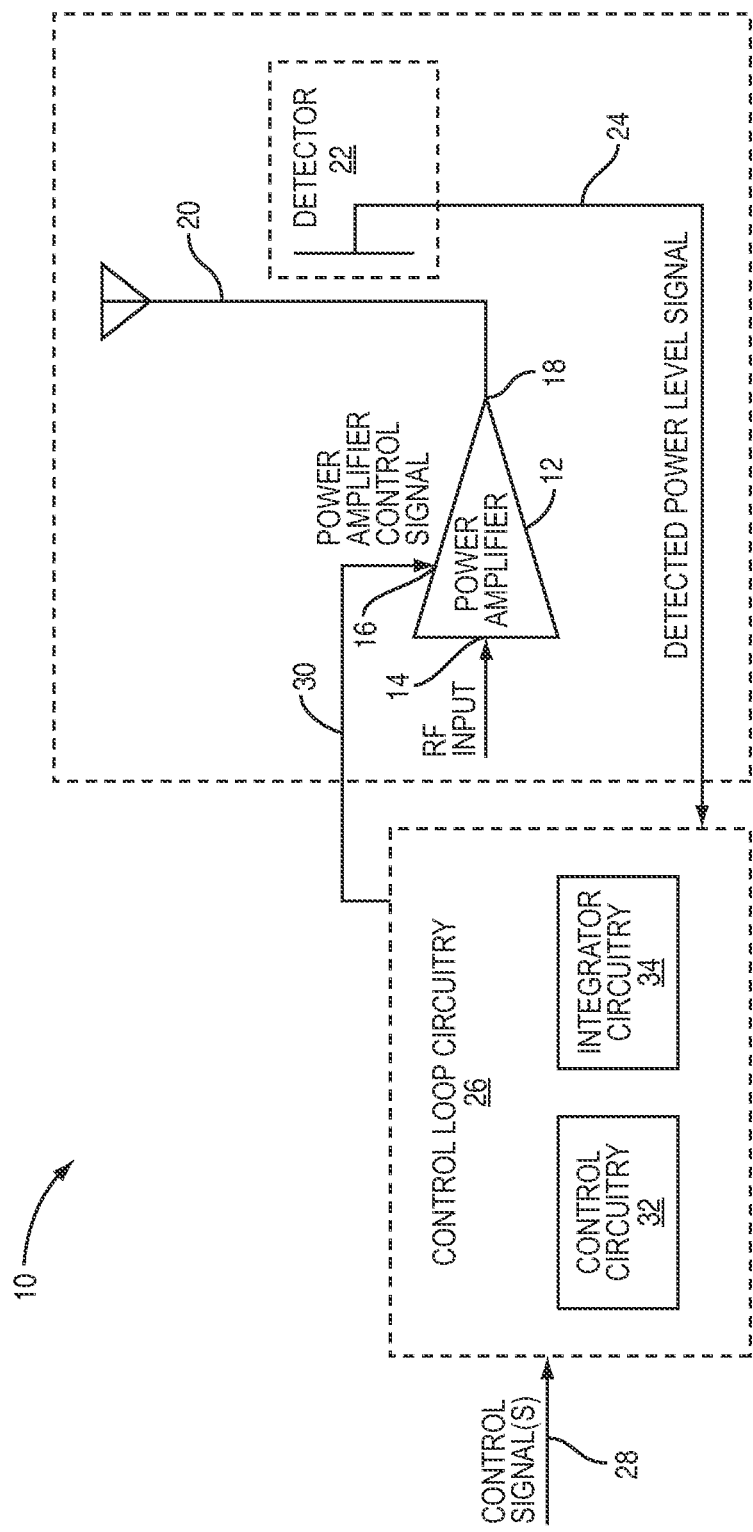
FIG. 1 depicts a control system adapted to control the power output level of a power amplifier.

FIG. 1 depicts mobile terminal 10 adapted to control the power output level of a power amplifier 12. The mobile terminal 10 includes a power amplifier 12 having an RF input 14 adapted to receive an RF modulated signal for transmission. The power amplifier 12 also includes a power amplifier control input 16 adapted to receive a power amplifier control signal, which is described below in further detail. The power amplifier control signal 16 allows the mobile terminal 10 to control the gain and/or power output of the power amplifier 12.

The power amplifier 12 further includes a power amplifier output 18 coupled to antenna 20. The output power of power amplifier 12 may be detected by detector 22, which is in communication with the power amplifier 12 and antenna 20. Detector 22 detects the power delivered by the power amplifier 12 to the antenna 20, and generates a detector power level signal 24, which is in communication with control loop circuitry 26. The control loop circuitry 26 is adapted to receive the control signal(s) 28, which are described below in further detail, and generate a power amplifier control signal 30 to control the power amplifier 12. Control loop circuitry 26 includes control circuitry 32 and an integrator circuitry 34.

Based upon the detector power level signal 24 and the control signal(s) 28, the control loop circuitry 26 generates a power amplitude control signal 30. The power amplitude control signal 30 may control the gain of the power amplifier 12 and the output power level of the power amplifier 12. The power amplitude control signal 30 may be pre-charged to include a power amplifier pedestal voltage that ensures the power amplifier output will comply with the ETSI specification requirements for both a time mask and a spectral mask during a commencement of transmission burst. One example of a power amplitude control signal 30 is depicted in FIG. 2, which depicts the power amplitude control signal 30 generated by the control circuitry 32 of FIG. 3 as discussed in greater detail below.

Figure 2:
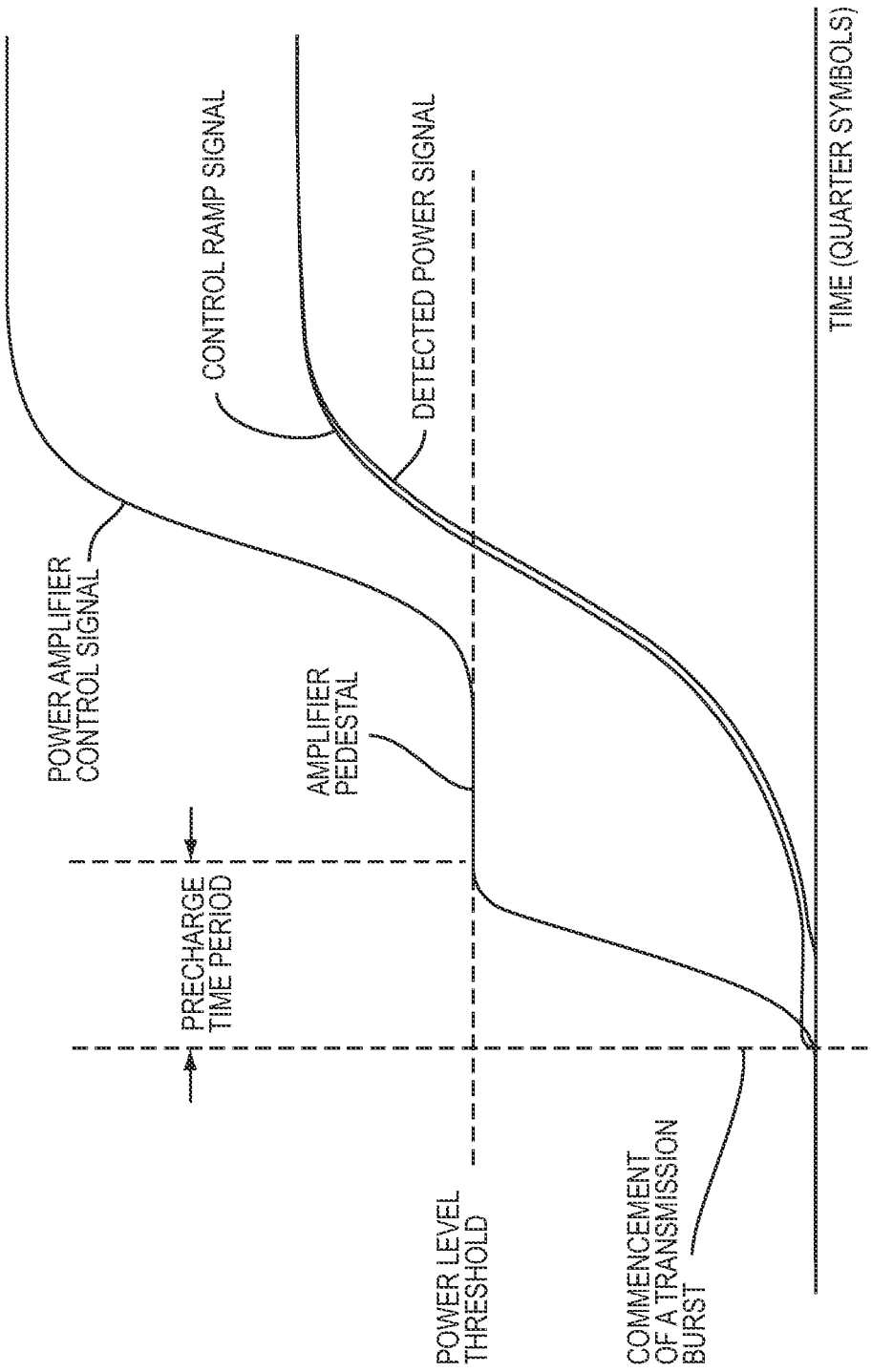
FIG. 2 depicts an example power amplifier control signal generated by the example control circuit of FIG. 3.

FIG. 2 depicts a power amplifier control signal generated by the control loop circuitry 26 in response to commencement of a transmission burst. During the pre-charge time period, the integrator circuitry 34 operates with a first bandwidth to pre-charge a capacitor of integrator circuitry 34 of the control loop circuitry 26. After the power amplifier control signal reaches a power threshold level, the integrator circuitry 34 operates with a second bandwidth to ensure stable operation of the power amplifier and to track the control ramp signal.

Figure 3:
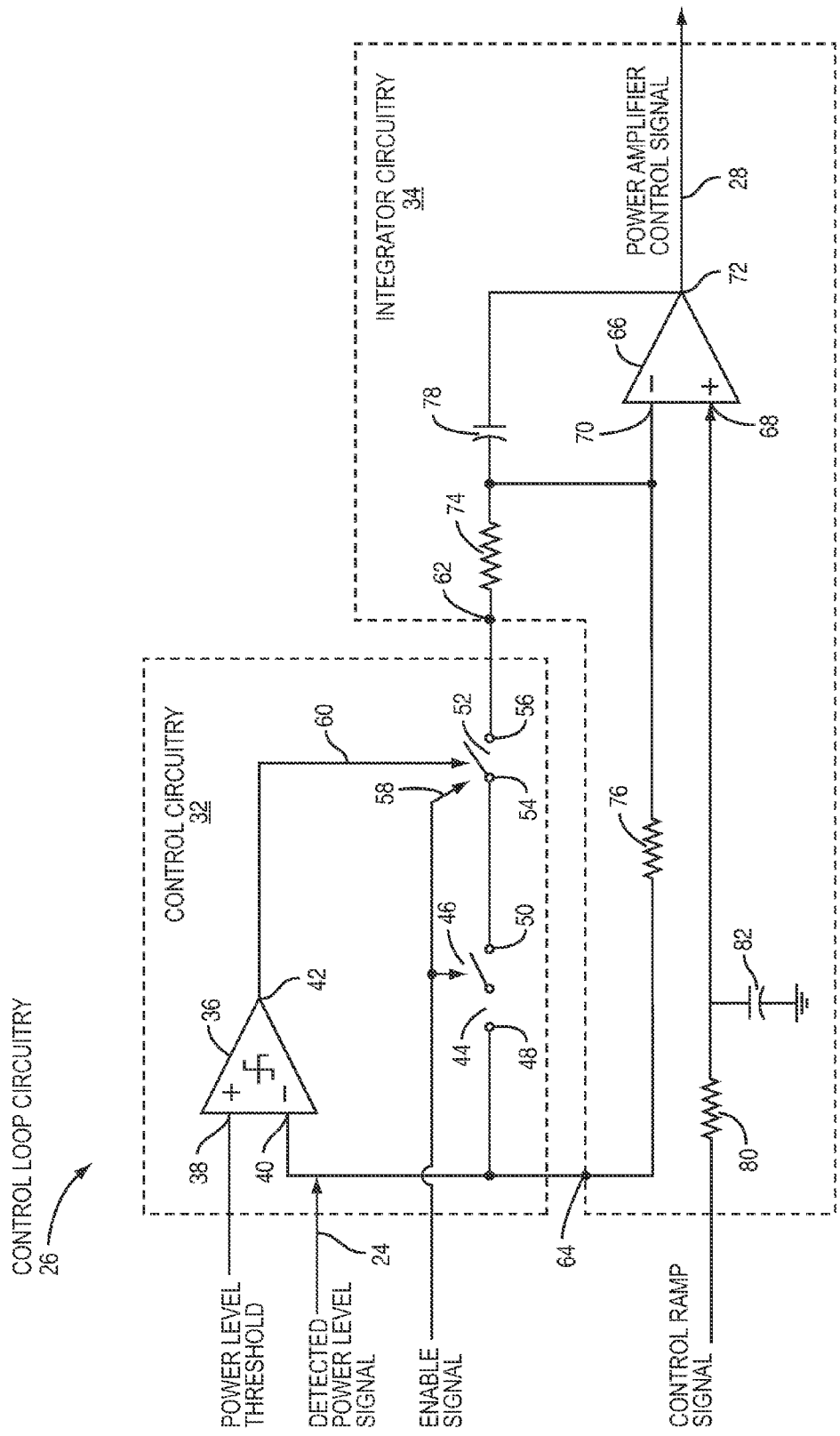
FIG. 3 depicts an example of a control circuit for controlling the bandwidth of control loop circuitry.

FIG. 3 depicts a first example of the control loop circuitry 26 of a mobile terminal with continuing reference to FIGS. 1-2. The control loop circuitry 26 may include a first example of the control circuit 32 and a first example of the integrator circuitry 34. Control circuit 32 includes a comparator 36, a comparator non-inverting input 38, a comparator inverting input 40, and a comparator output 42.

The comparator non-inverting input 38 receives a power level threshold that is used as a reference signal to determine when the comparator output 42 transitions from a LOW state to a HIGH state and from a HIGH state to a LOW state. The comparator inverting input 40 receives a detected power level signal 24 from detector 22. Comparator 36 compares the power level threshold to the detected power level signal 24, which corresponds to an amplifier pedestal level of the power amplifier control signal 30. If the detected power level signal 24 exceeds the power level threshold, the comparator output 42 is set to a logic LOW level. Alternatively, when the detected power level signal 24 is below the power level threshold, the comparator output 42 is set to a logic HIGH output level.

The control loop circuitry 26 further includes a first switch 44. The first switch 44 includes a first switch control input 46, a first switch input 48, and first switch output 50. The first switch input 48 is coupled to the comparator inverting input 40 and adapted to receive the detected power level signal 24. The first switch control input 46 is coupled to an enable signal. The enable signal may be a transmission burst enable signal that indicates a commencement of a transmission burst to be transmitted by the power amplifier 12. The first switch output 50 is in communication with a second switch 52.

The control loop circuitry further includes the second switch 52. The second switch 52 includes a second switch input 54 and a second switch output 56. Second switch 52 further includes a first switch control 58 and a second switch control 60.

The first switch control 58 of the second switch 52 is coupled to receive the enable signal. The second switch output 56 of second switch 52 is coupled to a first node 62 of the integrator circuitry 34. A second node 64 of the integrator circuitry 34 is configured to receive a detected power level signal 24. The second node 64 is also coupled to the comparator inverting input 42 and the first switch input 48 of the first switch 44.

The integrator circuitry 34 includes an operational amplifier 66 having a non-inverting amplifier input 68, an inverting amplifier input 70, and an operation amplifier output 72. A resistor 74 is coupled between the first node 62 and the inverting amplifier input 70. The resistor 76 is coupled to the second node 64 and the inverting amplifier input 70 of operational amplifier 66.

Depending upon the operation of first switch 44 and second switch 52, the resistor 74 and the resistor 76 may be configured to operate in parallel. An integrator capacitor 78 is coupled between the inverted amplifier input 70 and the operational amplifier output 72.

The resistor 74, the resistor 76, and the capacitor 78 form an integrator circuit with the operational amplifier 66. When either the first switch 44 or the second switch 52 are open, the resistor 76 and the integrator capacitor 78 form a first time constant for the integrator circuitry 34. Accordingly, the first time constant associated with either the first switch 44 or the second switch 52 being open corresponds to a first bandwidth of the control loop circuitry 26. When both the first switch 44 and second switch 52 are closed, the resistors 74 and 76 are in parallel and form a second time constant with the integrator capacitor 78. The second time constant is lower than the first time constant and corresponds to a second bandwidth of the control loop circuitry 26. As a result, the control loop circuitry 26 of mobile terminal 10 has a plurality of bandwidths that depend upon the state of the first switch 44 and the second switch 52.

The non-inverting amplifier input 68 may be coupled to a control ramp signal 69, which is depicted in FIG. 2. The control ramp signal may be an analog signal provided by a transceiver integrated chip (not shown). The power amplifier output power level may be based, at least in part, on the control ramp signal. For example, the control ramp signal may be used to control the output power of a power amplifier 12 configured to operate in a Gaussian Minimum Shift Keying (GMSK) mode of operation. As an example, Gaussian Minimum Shift Keying is a form of modulation used for radio communications applications including GSM cellular technology. The control ramp signal may include a pedestal level that is asserted at the start of a transmission burst.

The integrator circuitry 34 may further include a resistor 80 and a second capacitor 82 configured to low-pass filter the control ramp signal prior to receipt by the operational amplifier 66.

Operationally, in response to receiving an enable signal at the commencement of a transmission burst, the first switch 44 and the second switch 52 are closed, which places resistor 74 and 76 in parallel. During this period of operation, the integrator circuitry 34 has a first bandwidth associated with the time constant created by the parallel resistance of resistor 74, 76 and the integrator capacitor 78. As a result, the capacitor 78 is charged based upon the difference of the detected power signal 24 and the non-inverting input 68 through the parallel resistance created by the resistor 74 and the resistor 76. The enable signal may be a signal indicating commencement of a transmission burst. Prior to the beginning of a transmission broadcast, the control ramp signal may be set to include a pedestal voltage to pre-charge the output of integrator 78. After the detected power level signal of the power amplifier 12 exceeds the power level threshold at the comparator non-inverting input 38, comparator 36 will generate a logic-hide signal to open the switch 52. The power level threshold may be slightly greater than the minimum output level of the detector 22.

Thereafter, the second switch 52 opens and the resistor 74 is no longer in parallel with resistor 76, which effectively increases the resistance seen by the capacitor 78. Accordingly, when the second switch 52 is open, the bandwidth of the control loop formed with integrator circuitry 34 is decreased and the time constant formed by resistor 76 and the capacitor 78 increases. Thereafter, the power amplifier control signal 28 follows the control ramp signal at the non-inverting amplifier input 68.

Figure 4:
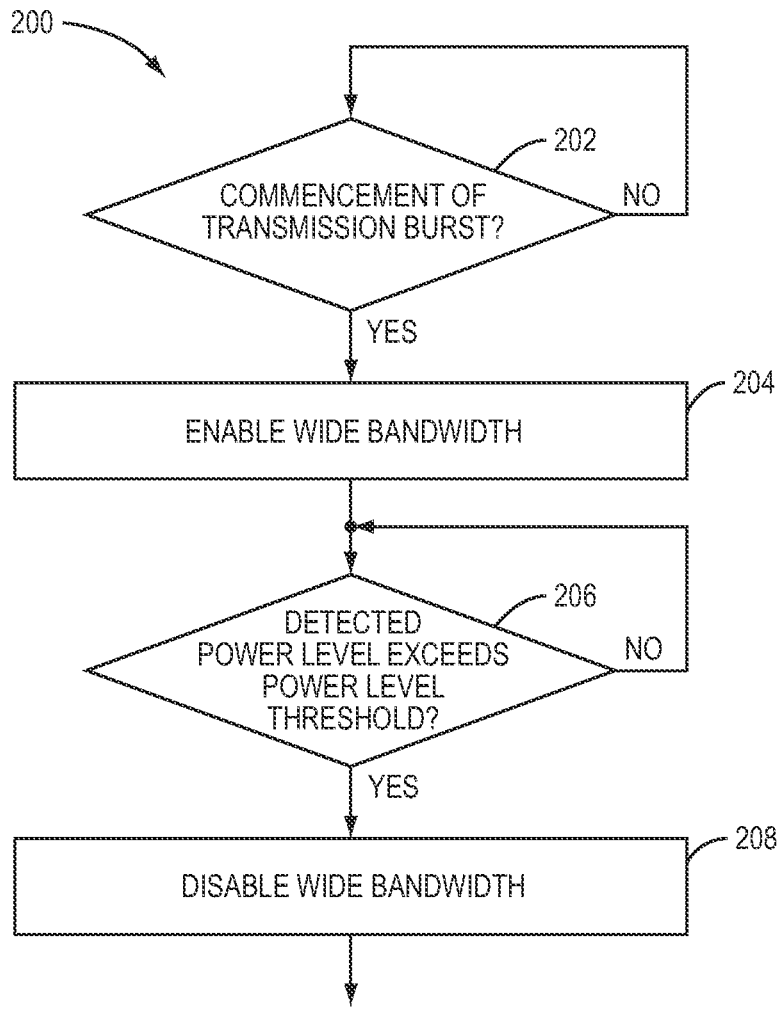
FIG. 4 depicts an example process for controlling the bandwidth of the control loop circuitry.

FIG. 4 depicts operations 200 of the mobile terminal 10 to control the output power level delivered by the power amplifier 12 to an antenna 20. Based upon the enable signal, control circuitry 32 detects whether commencement of a transmission burst has occurred. If the enable signal is de-asserted, control circuitry 32 continues to monitor the enable signal to determine the commencement of the transmission of burst (act 202). Upon detection of commencement of a transmission burst, control circuitry 32 enables the integrator circuitry 34 to operate with a wide bandwidth (act 204). In other words, the effective resistance seen by the integrator capacitor 78 is decreased to lower the effective time constant which increases the bandwidth of the integrator circuitry 34.

The control circuitry 32 monitors the detected power level signal 24 relative to the power level threshold. When the detected power level is less than the power level threshold, the control circuitry 32 continues to determine whether the detected power level exceeds the power level threshold (act 206). Upon detection that the detected power level exceeds the power level threshold, control circuitry 32 disables the wide bandwidth operation mode (act 208). As a result, the bandwidth of the control loop for controlling the power amplifier 12 is decreased, which corresponds to an increased time-constant of integrator circuitry 34. Thereafter, the operations 200 are completed.

Figure 5:
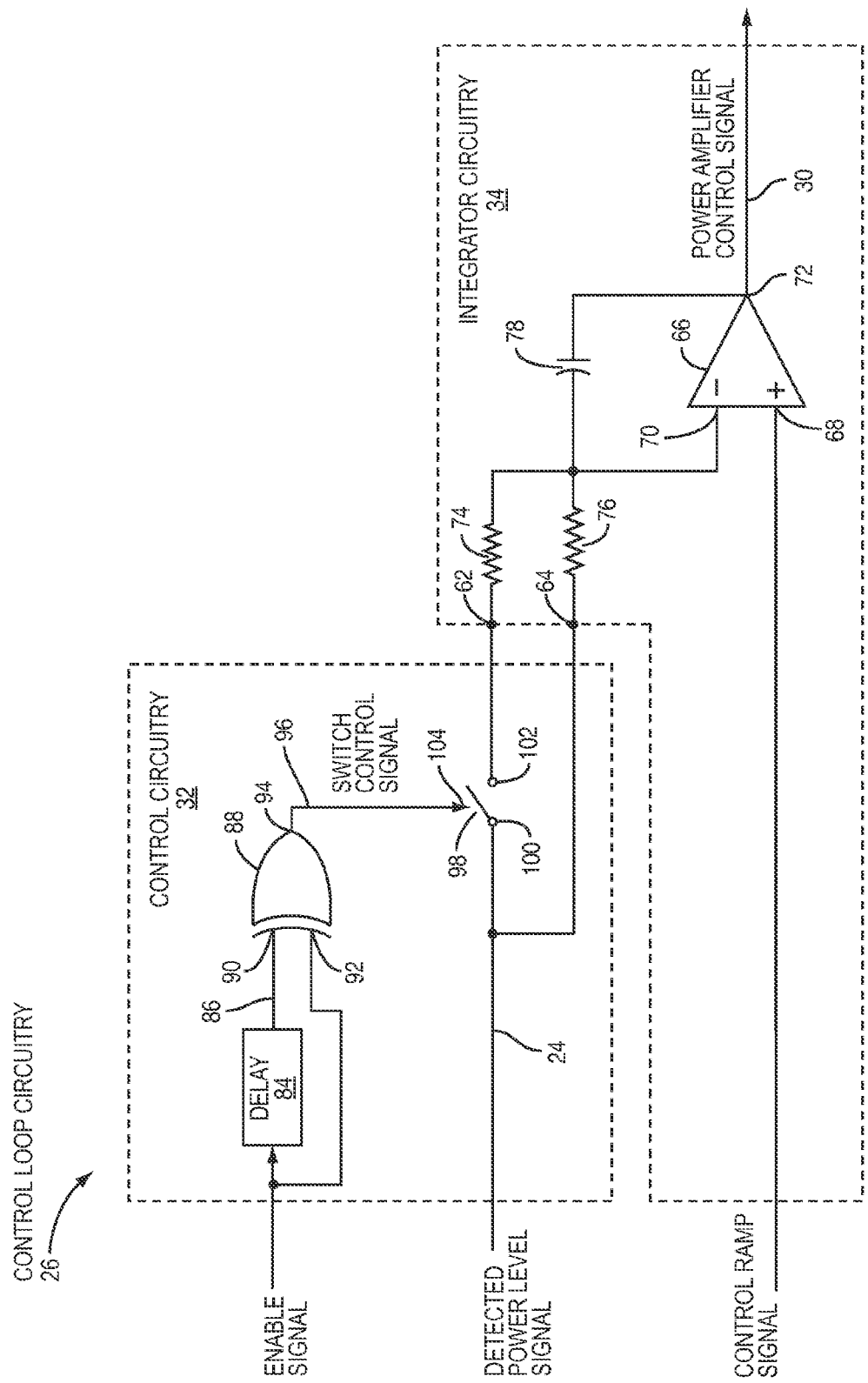
FIG. 5 depicts another example of a control circuit for controlling the bandwidth of the control loop circuitry.

FIG. 5 depicts another example of the control loop circuitry 26 of mobile terminal 10. In particular, FIG. 5 depicts a time based example of the control circuit 32 interfaced with the integrator circuitry 34 of FIG. 3.

The control circuit 32 includes a delay element 84 adapted to receive the enabled signal. Delay element 84 generates a delay enable signal 86 as an output. An XOR gate 88 includes a first XOR gate input 90, a second XOR gate input 92, and an XOR gate output 94. The output of delay element 84 is coupled to XOR gate input 90. Second XOR gate input 92 is configured to receive the enable signal. When the enable signal is asserted, the XOR gate output 94 generates a switch control signal 96 to control switch 98 having a pulse width equal to the delay of the delay element 84.

Control switch 98 includes a switch input 100, a switch output 102, and a switch control input 104. The switch input 100 is configured to receive the detector power signal 24. The switch output 102 is configured to couple with the first node 62 of the integrator circuitry 34. The switch input 100 is coupled to the second node 64 of the integrator circuitry 34.

Integrator circuitry 34 operates similarly to that as described regarding the integrator circuitry of FIG. 3. However, the control circuit 32 operates based on generation of a specific pulse width to close the switch 98 for a period of time. When switch 98 is closed, the integrator circuitry 34 is placed into a high bandwidth mode. After the switch control signal 96 is de-asserted, switch 98 opens, and the integrator circuitry 34 operates in the low bandwidth mode of operation.

Figure 6:
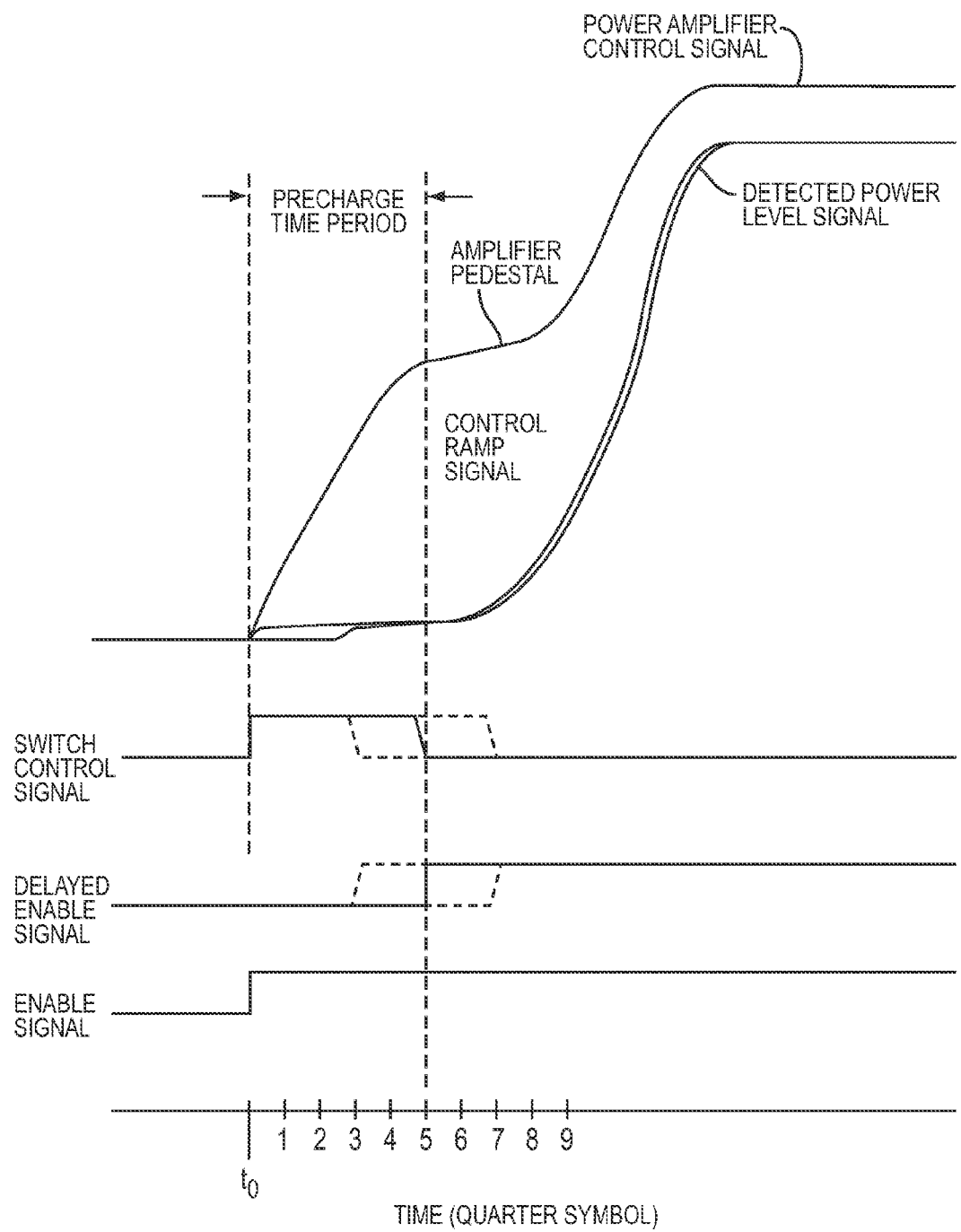
FIG. 6 depicts operation of the control circuit of FIG. 5 relative to the output and inputs of FIG. 1.

FIG. 6 depicts an example power amplifier control signal 28, a control ramp signal 69 and a detected power level signal 24 relative to a switch control signal and enable signal of FIG. 5 and time measured in quarter symbols. A quarter symbol may be defined as a fourth of a symbol time as defined by ETSI for the GMS system and corresponds to about 12/13 microseconds. The power amplifier control signal 28 may include an amplifier pedestal. As depicted in FIG. 6, the switch control signal has a nominal period of five quarter symbols, which corresponds to a delay of five quarter symbols through the delay element 84. The switch control signal corresponds to the precharge time period.

As discussed previously, the switch control signal depends upon delay of delay element 84. The delay of delay element 84 may nominally be set to five quarter symbols plus or minus two quarter symbols. As depicted in FIG. 6, the generated delay enable signal 86 corresponds to a five quarter symbol delay.

Figure 7:
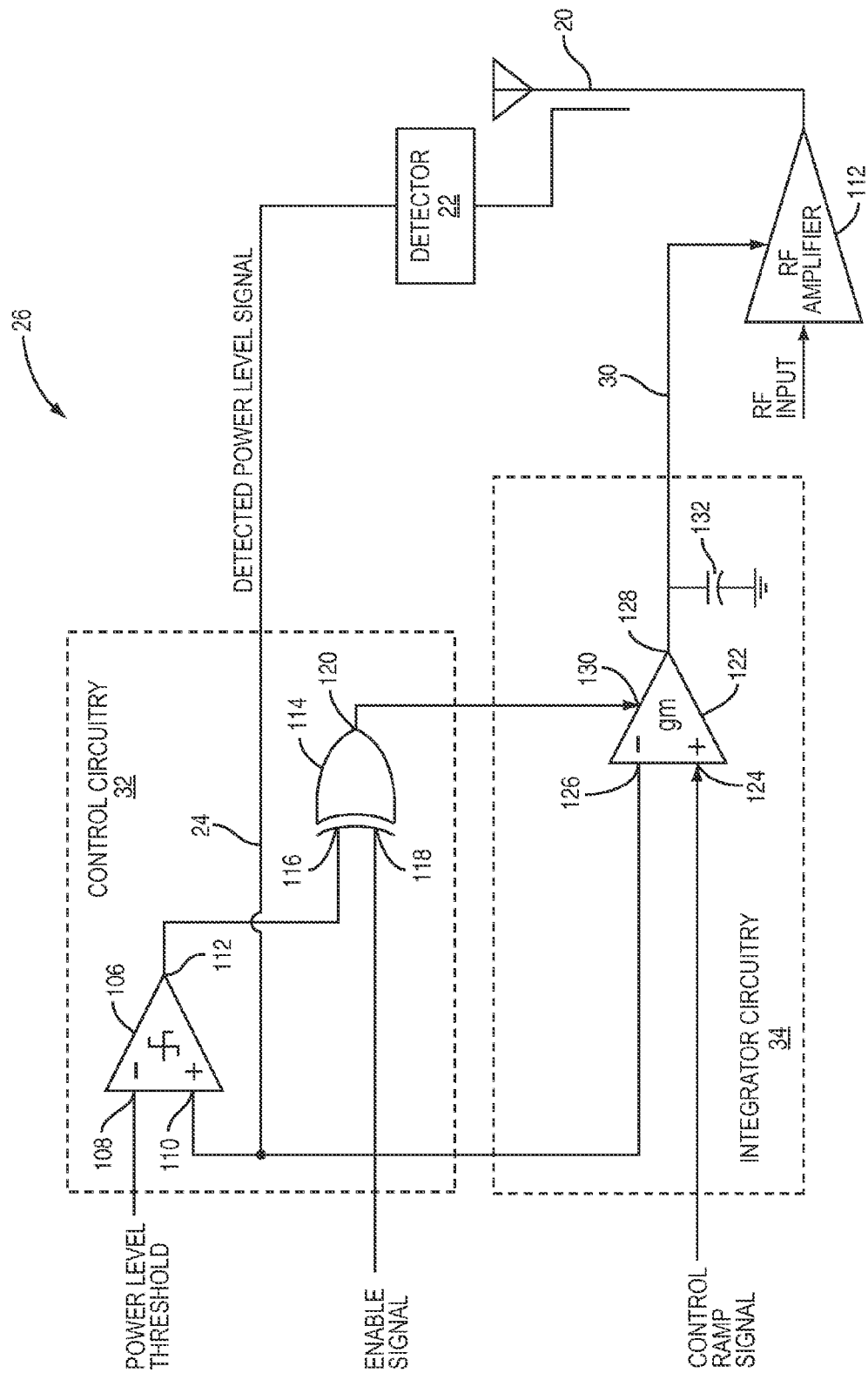
FIG. 7 depicts another example of a control circuit and a transconductance amplifier based integrator for controlling the bandwidth of the control loop circuitry.

FIG. 7 depicts another example of the control loop circuitry 26 of mobile terminal 10. The control loop circuitry 26 of FIG. 7 includes additional examples of control circuitry 32 and integrator circuitry 34. Control circuitry 32 may include comparator 106 having a comparator inverting input 108, comparator non-inverting input 110, and comparator output 112.

As described before, relative to FIG. 2, comparator non-inverting input 110 receives a detected power signal 24 from detector 22. The detected power level signal is compared to the power level threshold received by the comparator inverting input 108. When the detector power signal 24 is less than the power level threshold, comparator 106 generates a logic LOW state at the comparator output 112. However, when the detector power signal 24 exceeds the power level threshold, comparator 106 outputs a logic HIGH state at the comparator output 112.

The control circuitry 32 further includes an XOR gate 114 having a first XOR gate input 116 coupled to the comparator output 112 and a second XOR gate input 118 configured to receive the enable signal. The XOR gate 114 generates a control signal 120 for controlling the transconductance parameter of the transconductance amplifier 122 of the integrator circuitry 34.

The transconductance amplifier 122 further includes a non-inverting amplifier input 124, an inverting amplifier input 126, a transconductance amplifier output 128, and a transconductance control input 130. The transconductance amplifier output 128 may be coupled to the capacitor 132 to form an integrator circuit. The transconductance amplifier output 128 provides a power amplifier control signal 30 to the power amplifier 12.

Operationally, upon assertion of the enable signal, the XOR gate 114 detects the commencement of a transmission burst and sets the XOR output 120 to a logic HIGH state. Upon receipt of the logic HIGH state, the transconductance amplifier 122 increases the transconductance of the transconductance amplifier, which decreases the time-constant created by transconductance and the integrator capacitor 132. As a result, the overall bandwidth of the control loop circuitry increases.

Upon detection of the detected power level signal 24 exceeding the power threshold level at the inverting input of the comparator inverting input 108, comparator 106 sets the comparator output 112 to a logic HIGH state. When the comparator output 112 is set to a logic HIGH state, the XOR output 120 is set to a logic LOW state. When the transconductance control input 130 is set to a logic LOW STATE, the transconductance value of the transconductance amplifier 122 is reduced. The reduction in the transconductance of the transconductance amplifier 122 increases the time constant created by the transconductance of the transconductance amplifier 122 and the integrator capacitor 132. The increase in the time constant in the control loop effectively decreases the bandwidth of the integrator circuitry 34 and the control loop circuitry 26.

Figure 8:
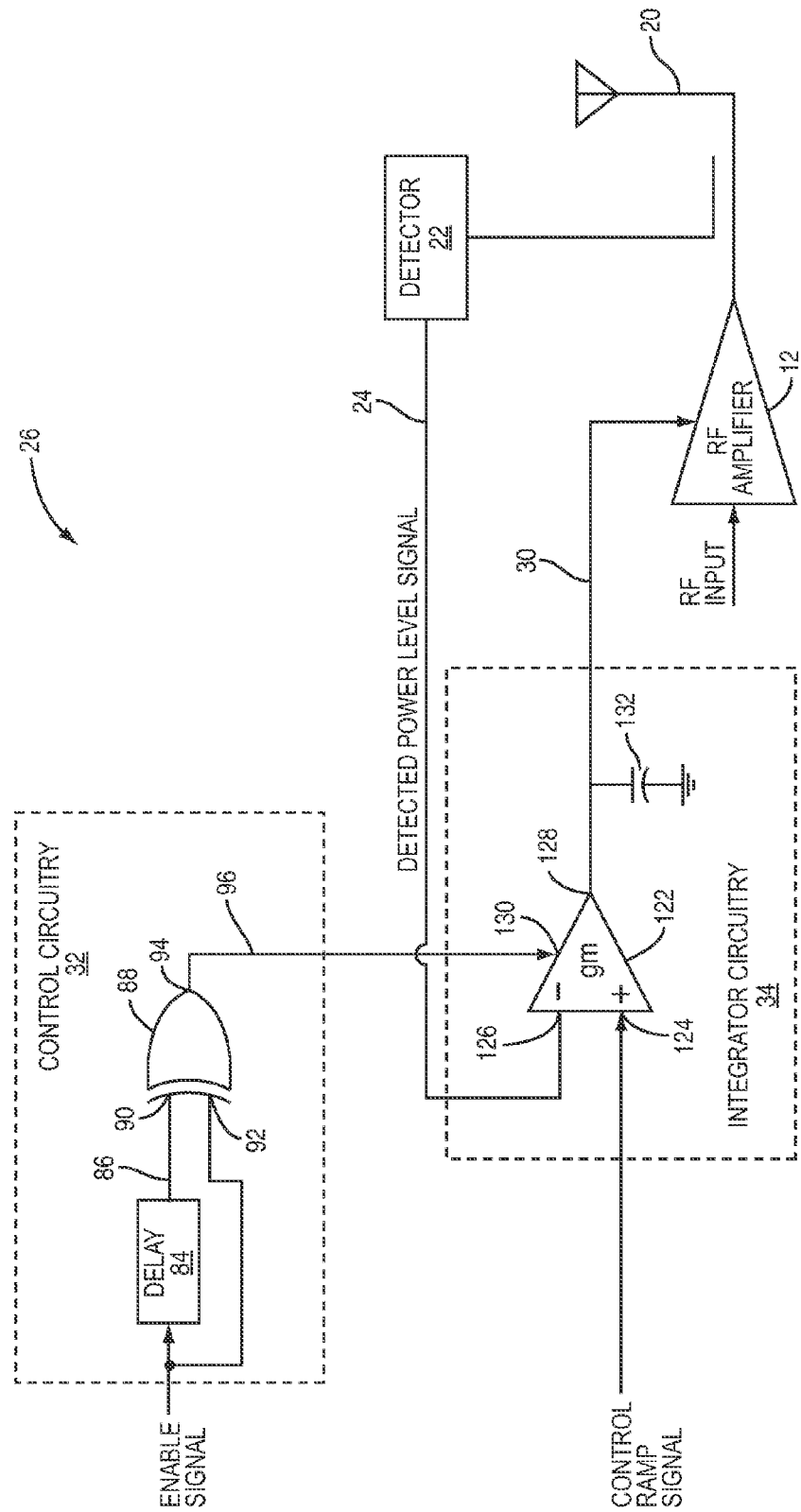
FIG. 8 depicts another example of a control circuit and the integrator of FIG. 7.

FIG. 8 depicts another embodiment of the control loop circuitry 26 of mobile terminal 10, which includes the control circuitry 32 of FIG. 4 combined with the example integrator circuitry 34 of FIG. 7. As described before, the control circuitry 32, depicted in FIGS. 4 and 7, generates an output pulse having a duration equal to the delay provided by the delay element 84. The XOR logic gate 88 generates the switch control signal 96, as described before, to control the transconductance of the transconductance amplifier 122. When the XOR output 94 is a logic low state, the transconductance of the transconductance amplifier 122 is reduced to form a first time constant with the integrator capacitor 132. When the logic level output of the XOR gate 94 is asserted to a logic HIGH state, the transconductance of the transconductance amplifier 122 is increased, which forms a second time constant with the integrator capacitor 132. As a result, the switch control signal permits the integrator circuitry 34 of FIG. 8 to operate with either a first bandwidth or a second bandwidth where the first bandwidth is greater than the second bandwidth. Accordingly, the bandwidth of the control loop circuitry 26 is selectively changed based upon the receipt of the enable signal and the delay provided by delay element 84.

Those skilled in the art will recognize improvements and modifications to the embodiments of the present disclosure. All such improvements and modifications are considered within the scope of the concepts disclosed herein and the claims that follow.

What is claimed is:

1. A method for controlling power delivered to an antenna of a communication system comprising:
    detecting a commencement of a transmission burst period;
    controlling an output power level delivered by a radio frequency power amplifier to the antenna during a first portion of the commencement of the transmission burst period based upon a first bandwidth of a control loop circuit; and
    controlling the output power level delivered by the radio frequency power amplifier to the antenna during a second portion of the commencement of the transmission burst period based upon a second bandwidth of the control loop circuit; and
    wherein the first portion of the commencement of the transmission burst is a precharge time period.

2. The method of claim 1, wherein the control loop circuit has a bandwidth further comprising:
    wherein controlling the output power level delivered by the radio frequency power amplifier to the antenna during the first portion of the commencement of the transmission burst period based upon the first bandwidth of the control loop circuit comprises:
    receiving a first control signal to selectively set the bandwidth of the control loop circuit to the first bandwidth;
    wherein controlling the output power level delivered by the radio frequency power amplifier to the antenna during the second portion of the commencement of the transmission burst period based upon the second bandwidth of the control loop circuit comprises:
    after receipt of the first control signal, generating a second control signal to selectively set the bandwidth of the control loop circuit to the second bandwidth.

3. The method of claim 1, wherein the first bandwidth is greater than the second bandwidth; and wherein the output power level delivered during the first portion of the commencement of the transmission burst period is less than the output power level delivered during the second portion of the commencement of the transmission burst period.

4. The method of claim 1, wherein the control loop circuit includes a current control amplifier having a selectable transconductance;
    wherein the control loop circuit has a bandwidth; and
    wherein controlling the output power level delivered by the radio frequency power amplifier to the antenna during the first portion of the commencement of the transmission burst period based upon the first bandwidth of the control loop circuit comprises:
    setting the selectable transconductance to a first transconductance corresponding to the first bandwidth; and
    wherein controlling the output power level delivered by the radio frequency power amplifier to the antenna during the second portion of the commencement corresponding to the second bandwidth of the control loop circuit comprises:
    setting the selectable transconductance to a second transconductance to set the bandwidth of the control loop circuit to the second bandwidth.

5. The method of claim 1, wherein the control loop circuit has a bandwidth, the method further comprising:
    receiving a control signal associated with the commencement of the transmission burst period; and
    selectively switching the bandwidth of the control loop circuit between the first bandwidth and the second bandwidth based at least on the control signal.

6. The method of claim 5, wherein selecting the bandwidth of the control loop circuit switching between the first bandwidth and the second bandwidth as a function of the control signal comprises:
    setting the bandwidth of the control loop circuit to the first bandwidth for a predetermined time period;
    setting the bandwidth of the control loop circuit to the second bandwidth after the predetermined time period; and
    wherein the first bandwidth is greater than the second bandwidth.

7. The method of claim 6, wherein the predetermined time period is between about three quarter symbols and about seven quarter symbols.

8. A communication system comprising:
    a power amplifier coupled to an antenna;
    a detector in communication with the antenna, the detector configured to detect a power level delivered to the antenna;
    a control loop circuit having a bandwidth, the control loop circuit in communication with the power amplifier and the detector, the control loop circuit configured to selectively set the bandwidth during at least a first portion of a commencement of a transmission burst, the control loop circuit configured to selectively set the bandwidth as a function of the power level delivered by the power amplifier to the antenna; and
    wherein the first portion of the commencement of the transmission burst is a precharge time period.

9. The communication system of claim 8, wherein the control loop circuit includes an integrator having a first time constant corresponding to a first bandwidth and a second time constant corresponding to a second bandwidth;
    the communication system further comprising:

the control loop circuit further configured to selectively set the bandwidth of the control loop circuit based upon selection of one of the first time constant and the second time constant.

10. The communication system of claim 8, the control loop circuit further configured to receive a control signal;
wherein the control signal is indicative of a commencement of a transmission burst period, the control loop circuit is further configured to set the bandwidth to a first bandwidth in response to receipt of the control signal; and
the control loop circuit is further configured to set the bandwidth to a second bandwidth in response to determination that the power level delivered to the antenna exceeds a power threshold level.

11. The communication system of claim 8, wherein the control loop circuit is further configured to set the bandwidth to a first bandwidth corresponding to a first range of the power level delivered to the antenna;
wherein the control loop circuit is configured to set the bandwidth to a second bandwidth corresponding to a second range of the power level delivered to the antenna;
wherein the second range of the power level delivered to the antenna is greater than the first range of the power level delivered to the antenna; and
wherein the first bandwidth is greater than the second bandwidth.

12. The communication system of claim 8, wherein the control loop circuit is configured to receive a control signal indicative of a commencement of a transmission burst, and in response to receipt of the control signal, the control loop circuit is further configured to set the bandwidth to a first bandwidth for a first period of time and set the bandwidth to a second bandwidth after the first period of time.

13. The communication system of claim 12, wherein the first period of time is greater than or equal to about three quarter symbol times and less than or equal to about seven quarter symbol times.

14. The communication system of claim 8, wherein the control loop circuit includes a transconductance amplifier having an adjustable transconductance;
the control loop circuit further configured to adjust the adjustable transconductance based upon the power level delivered to the antenna by the power amplifier.

15. The communication system of claim 14, wherein the adjustable transconductance includes a first range of transconductance values and a second range of transconductance values, wherein the first range of transconductance values is less than the second range of transconductance values;
wherein the control loop circuit is configured to adjust the adjustable transconductance to be within the first range of transconductance values based upon the power level delivered to the antenna being less than about a power threshold level; and
wherein the control loop circuit is configured to adjust the adjustable transconductance to be within the second range of transconductance values based upon the power level delivered to the antenna being greater than about the power threshold level.

16. A method for controlling a power amplifier of a communication system comprising:
detecting at least a first portion of a commencement of a transmission burst;
after detection of the commencement of the transmission burst, controlling a gain of an RF power amplifier with a feedback loop as a function of a first bandwidth of the feedback loop;
detecting whether a power level delivered by the RF power amplifier exceeds a power threshold;
in response to determination that the power level exceeds the power threshold, controlling the RF power amplifier with the feedback loop as a function of a second bandwidth of the feedback loop; and
wherein the first portion of the commencement of the transmission burst is a precharge time period.

17. The method of claim 16, wherein the first bandwidth is greater than the second bandwidth.

18. The method of claim 16, wherein controlling the gain of the RF power amplifier with the feedback loop as a function of the first bandwidth of the feedback loop comprises:
in response to determination that the power level is less than the power threshold, controlling the RF power amplifier with the control loop circuit as the function of the first bandwidth of the feedback loop.

19. The method of claim 16, wherein the RF power amplifier is controlled with the feedback loop as the function of the first bandwidth of the feedback loop for greater than about three quarter symbols and less than about seven quarter symbols;
regulating a power level delivered from a radio frequency power amplifier to an antenna during a first portion of the commencement of the transmission burst based upon the first bandwidth of the feedback loop; and
regulating the power level delivered from the radio frequency power amplifier to the antenna during a second portion of the commencement of the transmission burst based upon a second bandwidth of the feedback loop.

* * * * *